United States Patent [19]
Holst

[11] Patent Number: 6,084,454
[45] Date of Patent: Jul. 4, 2000

[54] START-UP CIRCUIT FOR WRITE SELECTS AND EQUILIBRATES

[75] Inventor: John C. Holst, San Jose, Calif.

[73] Assignee: Advanced Micro Devices, Inc., Sunnyvale, Calif.

[21] Appl. No.: 09/140,602

[22] Filed: Aug. 26, 1998

[51] Int. Cl.[7] .................................................. H03K 17/22
[52] U.S. Cl. ........................ 327/198; 327/143; 327/112; 365/226
[58] Field of Search .................................... 327/198, 143, 327/142, 112, 108; 365/226; 326/93, 95, 98

[56] References Cited

U.S. PATENT DOCUMENTS

| | | | |
|---|---|---|---|
| 5,402,081 | 3/1995 | Wong et al. | 327/108 |
| 5,467,037 | 11/1995 | Kumar et al. | 327/198 |
| 5,619,165 | 4/1997 | Fournel et al. | 327/143 |
| 5,682,105 | 10/1997 | Fujima | 327/198 |
| 5,864,247 | 1/1999 | Hirano et al. | 327/198 |
| 5,903,500 | 5/1999 | Tsang et al. | 327/112 |

*Primary Examiner*—Timothy P. Callahan
*Assistant Examiner*—Terry L. Englund
*Attorney, Agent, or Firm*—Skjerven, Morrill, Macpherson, Franklin, & Friel, LLP; Ken J. Koestner

[57] ABSTRACT

Some logic circuits preferentially reside in a particular state. Advantages are gained by a circuit that forces the circuit to the preferential state but allows the preferred state to be overridden. A node in the logic circuit is driven to a particular state, in one embodiment, by a pull-up transistor connected to a pull-down transistor that respectively drive the node to a high state and a low state. A keeper circuit is connected to the node and drives the node to the preferred state unless overpowered by the pull-up transistor and the pull-down transistor. The keeper circuit drives the node using a transistor that is weaker than the pull-up transistor and weaker than the pull-down transistor. A startup-circuit is connected to the node and drives the node to the preferred state when the node powers-up in the nonpreferred state. The start-up circuit drives the node using a transistor that is weaker than the keeper circuit transistor.

28 Claims, 8 Drawing Sheets

START-UP CIRCUIT FOR WRITE SELECTS AND EQUILIBRATES

BACKGROUND OF THE INVENTION

1. Field of the Invention

The present invention relates to start-up circuits for initializing logic circuits to a defined state. More specifically, the present invention relates to start-up circuits for usage in various memories and storages that initialize and hold a node to a preferred state unless overridden.

2. Description of the Related Art

Digital circuits such as microprocessors typically include system logic that responds to the application of operating power by resetting the microprocessor to a known state and asserting a RESET signal. The microprocessor samples the asserted RESET signal and immediately flushes and initializes all internal resources and the microprocessor internal state including the state of pipelines, caches and tag memories, the floating-point state, the state of special purpose processors such as a Multi-Media eXtension (MMX) processor, and all registers. The microprocessor typically jumps to a preset program address to being instruction execution.

The system power-up logic includes power-up initialization circuits that first place the digital circuits into a known state. Some digital circuits include self-resetting type logic for holding a circuit element to a known state without the usage of a dedicated reset signal. Unfortunately, the element must be held to a specified state. If the element powers up in the wrong state, the microprocessor is typically unable to initialize or initialization is extended to a long duration that consumes power.

Power-up initialization circuits are generally divided into two classes. A first class of power-up initialization circuits ensures that a node is placed in a predetermined state, generally either a digital high (VDD) state or a digital low (VSS) state, upon application of power to a circuit. A second class of power-on initialization circuits emits a momentary pulse of a selected time duration during power-up, then returns to a steady quiescent state.

For the first class of power-up initialization circuits, a node is placed in the predetermined state upon power-up usually by applying an increasing voltage to a gate of a transistor as the power supply voltage gradually increases in a linear ramp fashion. The power supply may ramp up at a wide range of rates. One of the problems addressed by the first class of power-up initialization circuit is the difficulty of achieving a consistent, robust response over a wide range of power-on ramping rates of the power supply.

The difficulty of attaining a suitable power-up initialization response is compounded for large and complex integrated circuits such as microprocessors. Microprocessors include many complex and highly diverse circuit portions that generate competing electrical effects, mainly capacitive coupling at various nodes in the integrated circuit, while devices are operating in the subthreshold voltage region. These competing electrical effects are sometimes critical to circuit performance.

For example, many storage or memory circuits include equilibrate lines that charge selected lines of bit and bit-bar (inverse logic) lines to the voltage supply reference VDD. The memory circuits also include write select lines that discharge selected lines of the bit and bit-bar lines to a reference VSS. However, unless the equilibrate and write select lines start-up in a defined suitable state, the multiple bit lines draw current in parallel, potentially causing a low enough impedance between the voltage supply reference VDD and the VSS reference power rails that the circuit fails to attain an adequate differential to operate the memory circuit and reset the equilibrate lines. Consequently, the integrated circuit never initializes and simply expends power uselessly.

One technique for placing the memory in a suitable state that does not waste power is to perform an initialization operation that performs a dummy read cycle. Unfortunately, the circuit may power-up in a state that does not allow the initialization operation to take place.

What is needed is a power-up initialization circuit that ensures designated internal circuit nodes are set in selected states within a suitable time duration. What is needed is a circuit and operating method for initializing nodes of a circuit to a known state during a power-up transient. What is further needed is a power-up initialization circuit and technique that performs initialization without activation of special reset signals. What is additionally needed is a power-up initialization circuit and operating method that guarantees the setting and maintaining of nodes to the known state.

SUMMARY

It has been discovered that some logic circuits preferentially reside in a particular state. Advantages are gained by a circuit that forces the circuit to the preferential state but allows the preferred state to be overridden. A node in the logic circuit is driven to a particular state, in one embodiment by a pull-up transistor connected to a pull-down transistor, that respectively drive the node to a high state and a low state. A keeper circuit is connected to the node and drives the node to the preferred state unless overpowered by the pull-up transistor and the pull-down transistor. The keeper circuit drives the node using a transistor that is weaker than the pull-up transistor and weaker than the pull-down transistor. A startup-circuit is connected to the node and drives the node to the preferred state when the node powers-up in the nonpreferred state. The start-up circuit drives the node using a transistor that is weaker than the keeper circuit transistor.

Many advantages are achieved by the described start-up circuit and operating technique. It is advantageous that selected nodes are guaranteed to be placed in a selected state upon start-up. It is further advantageous that nodes initialize to a known state without usage of a reset signal and that floating nodes are permanently held to a known state. The transient response of the power-up initialization circuit and operating method is fast. It is advantageous that the start-up circuit drives a circuit to a defined state without intervening operations such as dummy memory access operations.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE ILLUSTRATIVE EMBODIMENTS

Figure 1:
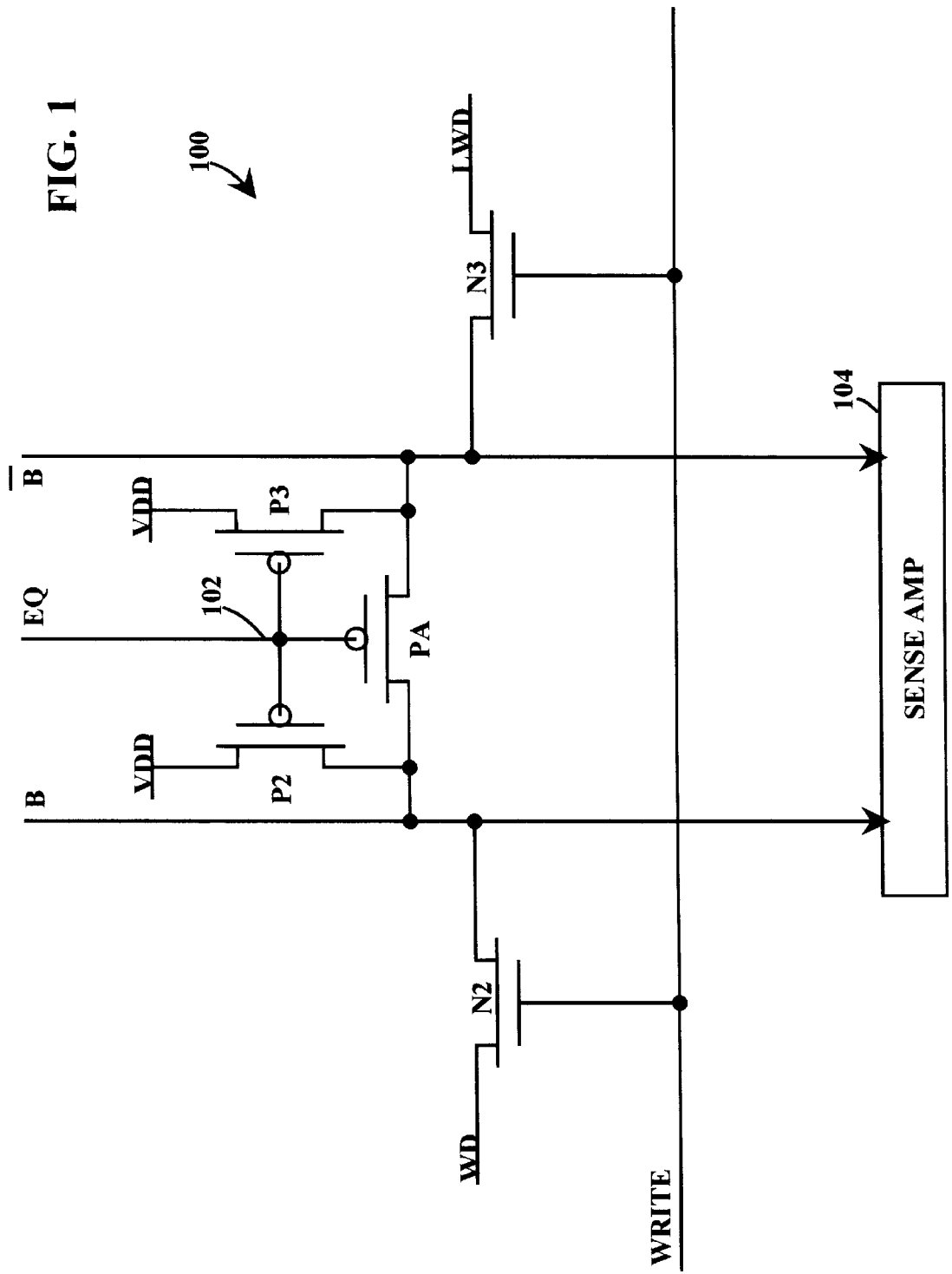
FIG. 1 is a schematic circuit diagram illustrating a memory control circuit including an equilibrate circuit for usage in a processor storage such as a tag memory.

Referring to FIG. 1, a schematic circuit diagram illustrates a memory control circuit 100 including an equilibrate circuit 102 for usage in a processor storage such as a tag memory or cache memory. The memory control circuit 100 includes a bit line B and a bit-bar line B#, that is the complement of the bit line B. Both the bit line B and the bit-bar line B# are connected to a sense amplifier 104 and transfer a signal from a selected memory cell (a bit) in the memory array to the sense amplifier 104. The equilibrate circuit 102 is used to charge and hold the bit line B and the bit-bar line B# to the positive rail at the voltage supply reference VDD. The equilibrate circuit 102 operates to charge and hold the bit line B and the bit-bar line B# to operate as a memory. The equilibrate circuit 102 operates switches connected to the bit line B and the bit-bar line B# to allow a memory cell to discharge the bit or bit-bar line and to allow write devices, n-channel MOSFETs N2 and N3 to drive data onto the bit lines and the bit-bar lines.

An equilibrate signal EQ drives the three-transistor equilibrate circuit 102. The equilibrate circuit 102 includes a first p-channel MOSFET PA that connects the bit line B and the bit-bar line B#. A second p-channel MOSFET P2 connects the bit line B to the voltage supply reference VDD. A third p-channel MOSFET P3 connects the bit-bar line B# to the voltage supply reference VDD. When the equilibrate signal EQ is asserted, the p-channel MOSFET PA ties the bit line B to the bit-bar line B#. The asserted equilibrate signal EQ also turns on the p-channel MOSFET P2 and the p-channel MOSFET P3, tying the bit line B and the bit-bar line B#, respectively, to the voltage supply reference VDD.

The memory control circuit 100 also includes an n-channel MOSFET N2 that selectively connects the bit line B to a write data line WD, and an n-channel MOSFET N3 that selectively connects the bit bar line B# to an L-write data line LWD. The n-channel MOSFET N2 and an n-channel MOSFET N3 are controlled by a write signal on a write line WRITE. The write signal controls the n-channel MOSFET N2 and the n-channel MOSFET N3 to pull either the bit line B or the bit-bar line B# low to the VSS reference. When the equilibrate signal EQ and the write select signal WRITE are simultaneously asserted, a current path is formed from the positive power rail of the voltage supply reference VDD to the negative power rail of the VSS reference.

The rail-to-rail current path is a through condition for multiple bit lines in a memory that is maintained until a clock signal is applied to the memory to initialize the equilibrate signal EQ and the write select signal WRITE to a stable condition. The problem with the rail-to-rail current path and through condition is that a cache memory, tag memory, and the like include a large number of bit lines. All or many bit lines may draw current simultaneously, potentially causing a low impedance between the positive rail of the voltage supply reference VDD to the negative rail of the VSS reference. The low rail-to-rail impedance potentially results in an inadequate voltage differential for operating the integrated circuit so that the integrated circuit never initializes but instead continues in an inoperable state, wasting power.

The equilibrate signal EQ is generally held in a low state any time that the bit line B is not accessed. However, the equilibrate signal EQ is transitioned and held to a high state during a memory access. If the memory is not accessed for reading or writing in a cycle, the equilibrate signal EQ is maintained in the low state so that the voltage is held essentially constant for a subsequent access and to avoid susceptibility to power supply noise.

One technique for controlling the equilibrate circuit 102 is to supply a self-resetting circuit that responds to a read clock signal by deactivating the equilibrate circuit 102 and reactivating the equilibrate circuit 102 following the memory read. A suitable self-resetting control circuit ensures that the equilibrate circuit 102 is not reactivated before the memory read is complete.

Figure 2:
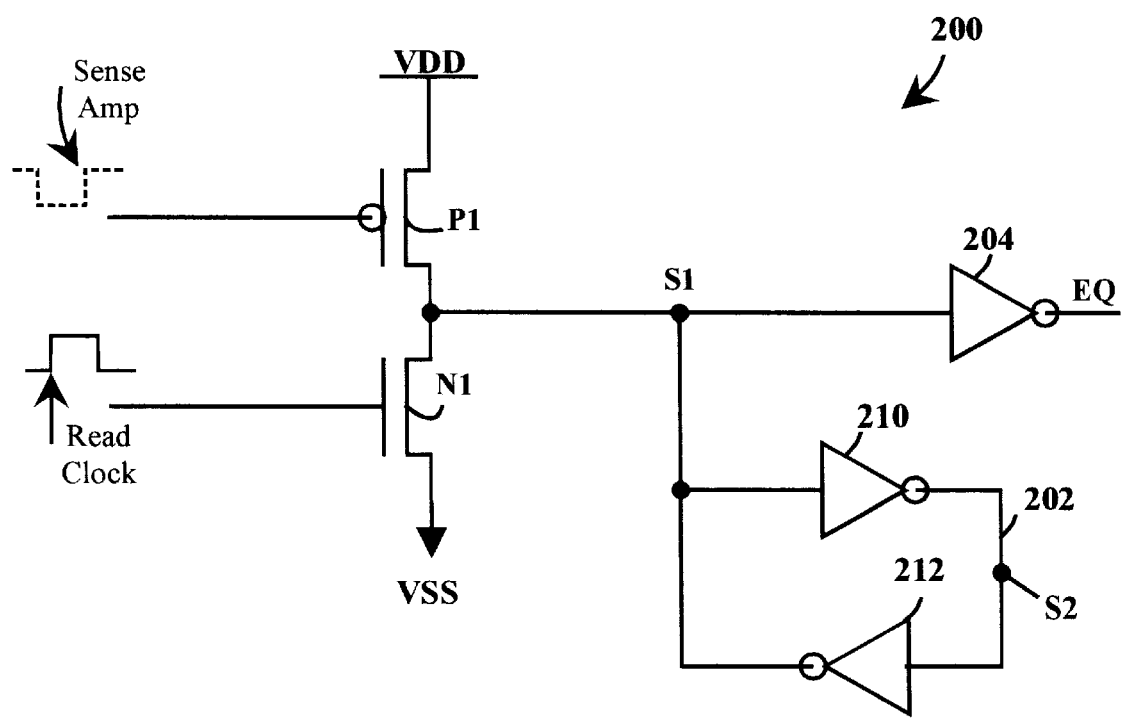
FIG. 2 is a schematic circuit diagram showing an embodiment of a equilibrate control circuit for controlling an equilibrate circuit.
Figure 3:
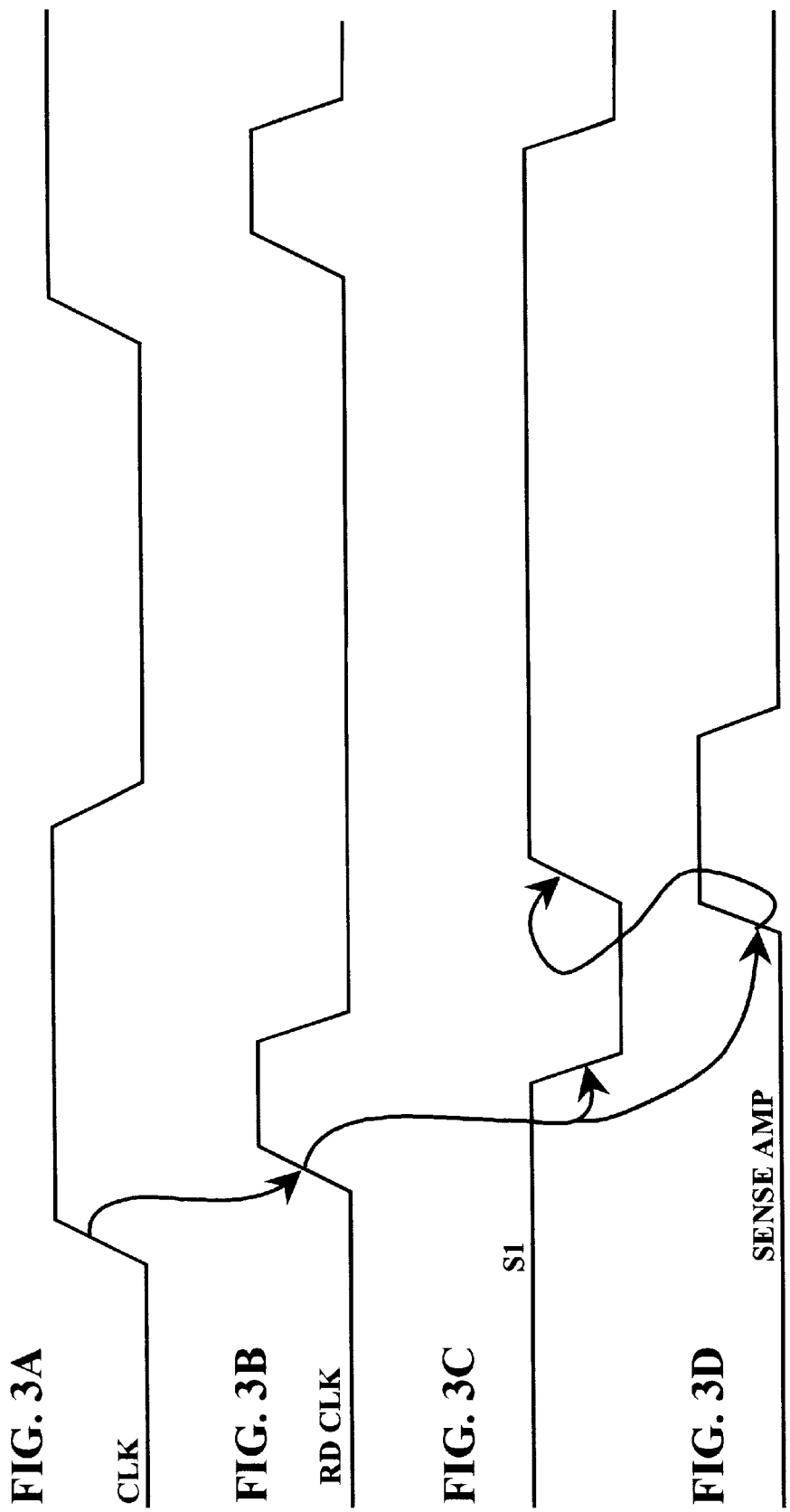
FIGS. 3A–3D are timing diagrams illustrating an example of the operation of the equilibrate control circuit shown in FIG. 2.

Referring to FIG. 2, a schematic circuit diagram illustrates a suitable circuit 200 for controlling the equilibrate signal EQ using a jam latch 202. The equilibrate control circuit 200 includes a pull-up p-channel MOSFET P1 connected in series with a pull-down n-channel MOSFET N1 having a source-drain pathway connected between the voltage supply reference VDD and the VSS reference. The gate of the p-channel MOSFET P1 is connected to a sense amplifier 104 and receives a sense amplifier output signal. The gate of the n-channel MOSFET N1 is connected to a read clock line. The p-channel MOSFET P1 and n-channel MOSFET N1 are connected at a node S1. The jam latch 202 is connected to the node S1 to hold the equilibrate signal EQ stable. The node S1 is connected to the equilibrate line carrying the equilibrate signal EQ through an inverter 204.

The jam latch 202 is a pair of cross-coupled inverters, for example a first jam latch inverter 210 and a second jam latch inverter 212 that feeds back to the node S1. The jam latch 202 is switched to a particular state by an input pulse and cleared by a subsequent pulse. The first jam latch inverter 210 is connected to the second jam latch inverter 212 at a node S2. Both the first jam latch inverter 210 and the second jam latch inverter 212 are constructed from small transistors relative to the size of the p-channel MOSFET P1 and the n-channel MOSFET N1. Therefore input signals to the equilibrate control circuit 200 predominate over the influence of the jam latch 202.

For example, a read clock signal is applied to the gate of the n-channel MOSFET N1 to activate the equilibrate circuit 102. The read clock is issued prior to a memory read operation to deactivate the equilibrate circuit 102, allowing reading of the memory without competing with the equilibrate circuit 102 for access to the bit lines. If the node S1 holds a "1" logic level and the node S2 holds a '0' logic level and a read clock input signal to the gate of the n-channel MOSFET N1 is high for a suitable time, the node S1 is driven to a "0" logic level. The n-channel MOSFET N1 is sufficiently large to overpower the jam latch 202, driving the "0" logic level at the node S1. The "0" logic level at node S1 drives the node S2 to a "1" level through the operation of the first jam latch inverter 210. The "1" level of the node S2 is inverted by the second jam latch inverter 212, reinforcing the "0" level of node S1.

Referring to FIGS. 3A–3D, a schematic timing diagram illustrates an example of the operation of the equilibrate control circuit 200. Prior to assertion of the read clock pulse, the memory control circuit (not shown, but in some embodiments may be the memory control circuit 100) that is controlled by the equilibrate control circuit 200 is precharged and prepared for memory access. A read operation is triggered by the rising edge of a system clock signal CLK that, in turn, drives the read clock signal RD CLK from a low logic level to a high logic level. The read clock RD CLK signal applied to the n-channel MOSFET N1 discharges the node S1, driving the logic level at node S1 from a "1" logic level to a "0" logic level and driving the equilibrate signal EQ to a "1" logic level. The "1" logic level of the equilibrate signal EQ deactivates the equilibrate circuit 102 shown in FIG. 1.

The equilibrate circuit 102 is deactivated until the data read is finished. The sense amplifier 104 is activated to sense the memory data and latch the data for reading, driving a sense amplifier signal SENSE AMP to a logic level "1". Typically data is read using a self-timed pulse that is activated by an input clock edge but is deactivated through the operation of the memory control circuit and not using timing signal edges. The SENSE AMP signal is passed back to the p-channel MOSFET P1, driving node S1 from a logic level "0" to the logic level "1", thereby setting the equilibrate signal EQ to a logic level "0" and activating the equilibrate circuit 102. The rising edge of the sense amplifier SENSE AMP signal immediately is passed back to the gate of the p-channel MOSFET P1 upon latching the data since the signal on the bit lines is no longer of use for holding the data signal values. Accordingly, the equilibrate control circuit 200 is a self-timed pathway that advantageously allows accessing of data without matching delays in data access circuits and tracking the timing of data access for the particular memory circuit. Thus, the equilibrate circuit 102 is deactivated during a data read but, when the data read is complete, the equilibrate circuit 102 is reactivated for as many cycles of the system clock signal CLK as desired. The processor may enter a stop clock mode in which the memory control circuit 100 is inactive and in an equilibrate state that precharges the bit lines B and bit-bar lines B# and prepares the memory control circuit 100 for subsequent read operations.

One disadvantage of the equilibrate control circuit 200 using the jam latch 202 is that the jam latch 202 is an element that holds a particular state but is not initialized by a power-on reset signal or other initialization signal. Thus, upon power-up, the jam latch 202 enters a particular state but the state is not a defined or specified state. The state of the node S1 in the equilibrate control circuit 200 may be either a logic "0" or a logic "1", but the state for a particular power-up is unknown and unknowable. If a memory or storage circuit enters an incorrect state upon power-up, a significant amount of power may be wasted. Furthermore, sine memories typically store operational program code and control data, an incorrect state of the storage circuit may result in defective logical performance. One technique for assuring that the equilibrate control circuit 200 enters a desired state is to perform a dummy read cycle upon start-up. Unfortunately, power is wasted and inappropriate operations may be performed prior to application of the dummy read cycle.

Figure 4:
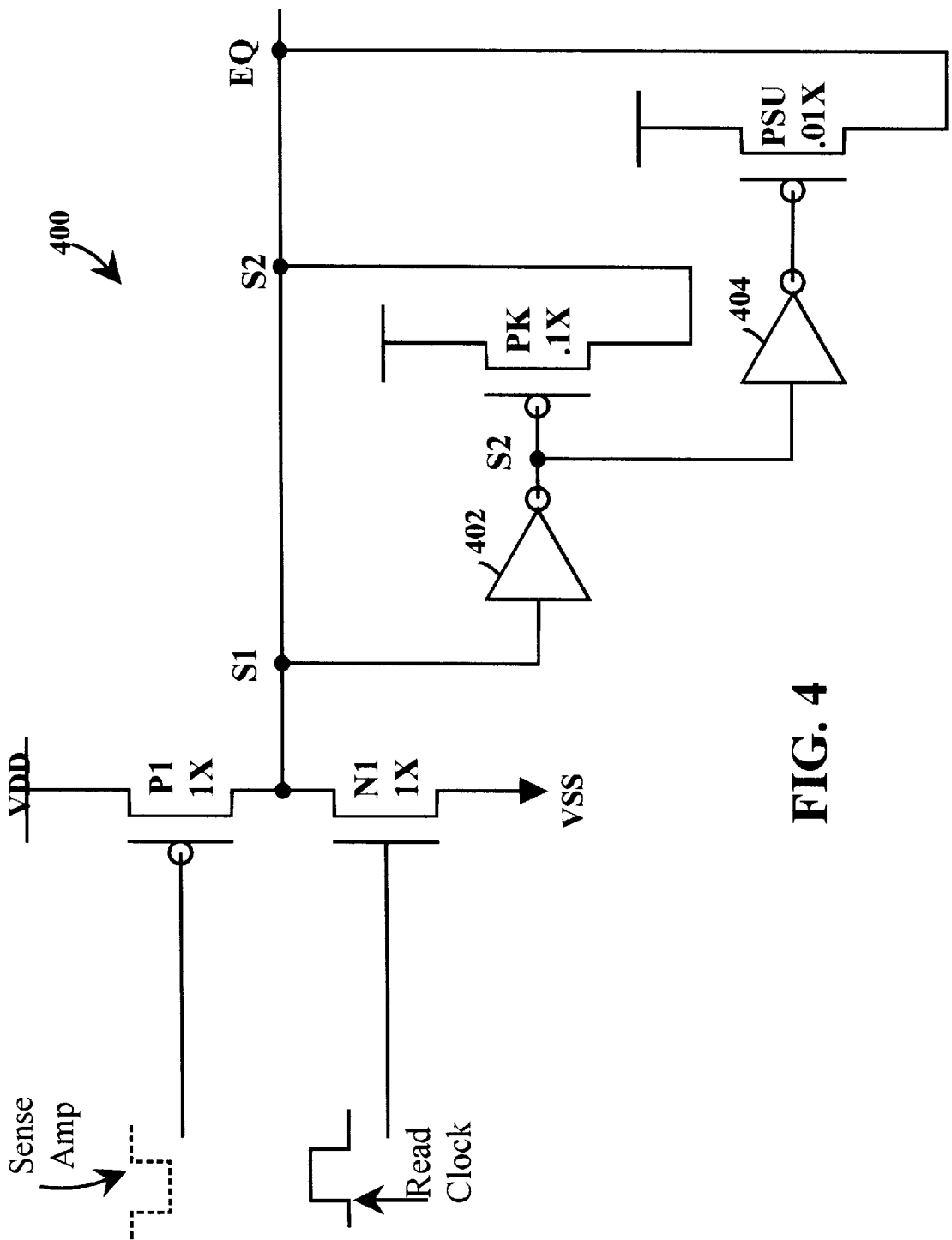
FIG. 4 is a schematic circuit diagram showing an embodiment of an equilibrate control circuit that includes logic for initializing the equilibrate control circuit in a defined state upon start-up.

Referring to FIG. 4, an alternative embodiment of a equilibrate control circuit 400 generates correct equilibrate signals EQ for controlling the equilibrate circuit 102 while entering a defined state upon start-up. The equilibrate control circuit 400 does not include a jam latch. Instead, the equilibrate control circuit 400 includes logic that holds the logic level of the node S1 to a stable state, subject to change in the event of control signals applied to the gates of a pull-up p-channel MOSFET P1 and a pull-down n-channel MOSFET N1.

The equilibrate control circuit 400 includes a first inverter 402 having an input terminal connected to the node S1 and an output terminal connected to a node S2 and a gate terminal of a "keeper" p-channel MOSFET PK. The keeper p-channel MOSFET PK has a source-drain pathway connected between the voltage supply reference VDD and the node S1. The equilibrate control circuit 400 also includes a second inverter 404 having an input terminal connected to the node S2 and an output terminal connected to a gate terminal of a "start-up" p-channel MOSFET PSU. The start-up p-channel MOSFET PSU has a source-drain pathway connected between the voltage supply reference VDD and the node S1.

The operational premise of the equilibrate control circuit 400 is that the node S1 is normally set at a high, logic "1" state. The node S1 transitions to the "0" state only for a brief instant to permit a read operation before the node S1 returns to the logic "1" state. The jam latch 202 shown in FIG. 2 is most suitable for a node that is in either a low state or a high state without preference. The jam latch 202 is less suitable for a node that transitions to a low state only for a short duration period and immediately returns to the high state.

The keeper p-channel MOSFET PK of the equilibrate control circuit 400, when the node S1 is in the high, logic "1" state, operates to keep the node S1 at the high, logic "1" state. When the node S1 is in the high, logic "1" state, the node S2 at the gate terminal of keeper p-channel MOSFET PK is at a low, logic "0" state so that the keeper p-channel MOSFET PK is activated to an "on" state. In the on state, the keeper p-channel MOSFET PK ties the node S1 to the voltage supply reference VDD, keeping the node S1 at the high, logic "1" state. In an alternative embodiment, an n-channel MOSFET may be connected in series with the keeper p-channel MOSFET PK having a source-drain pathway between the voltage supply reference VDD and the VSS reference. In the illustrative embodiment, the n-channel MOSFET is omitted since the node S1 is in the low, logic "0" state for such a short time, on the order of nanoseconds, that current leakage is not a problem. Current leakage is a concern over time durations of milliseconds and microseconds, but not nanoseconds.

In the condition that the node S1 powers-up in the low, logic "0" state, the first inverter 402 inverts the logic "0" signal to generate a high, logic "1" state at the node S2. The high, logic "1" state at the node S2 is inverted by the second inverter 404 to the low, logic "0" state which is applied to the gate terminal of the start-up p-channel MOSFET PSU. The start-up p-channel MOSFET PSU is activated to an "on" state, tying the node S1 to the voltage supply reference VDD and returning the node S1 to the high, logic "1" state.

In the illustrative embodiment, the p-channel MOSFET P1 and the n-channel MOSFET N1 are large devices in comparison to the keeper p-channel MOSFET PK and the start-up p-channel MOSFET PSU. In relative terms, the p-channel MOSFET P1 and n-channel MOSFET N1 have a conduction value of 1X. The keeper p-channel MOSFET PK, which keeps the node S1 in the high, logic "1" state when already in the state, has a conduction value reduced to a tenth, or 0.1X, of the size 1X. At a conduction value of 0.1X, the keeper p-channel MOSFET PK reduces coupling noise and leakage while holding the node S1 at the appropriate level. The start-up p-channel MOSFET PSU, which transitions the node S1 to the appropriate high, logic "1" state when the node S1 powers up in the incorrect low, logic "0" state, has a conduction value reduce to 0.01X. The start-up p-channel MOSFET PSU is a sufficiently small device to have little effect on the voltage during the small duration period when the node S1 is to remain in the low, logic "0" state.

In other embodiments, the equilibrate control circuit 400 may include MOSFETs with relatively different sizing and conduction values, although the p-channel MOSFET P1 and the n-channel MOSFET N1 are generally largest, the keeper p-channel MOSFET PK is intermediate in size, and the start-up p-channel MOSFET PSU is smallest.

The p-channel MOSFET P1 and the n-channel MOSFET N1 are large transistors in comparison to the keeper p-channel MOSFET PK. Typically the p-channel MOSFET P1 and the n-channel MOSFET N1 are at least three times larger than the keeper p-channel MOSFET PK.

Also the keeper-p-channel MOSFET PK is a large transistor in comparison to the start-up p-channel MOSFET PSU. The start-up p-channel MOSFET PSU is small so that the voltage level on the node S1 is only insignificantly affected during operating conditions in which the node S1 is to remain at the low voltage level. Typically the keeper p-channel MOSFET PK is at least three times larger than the start-up p-channel MOSFET PSU.

Figure 5:
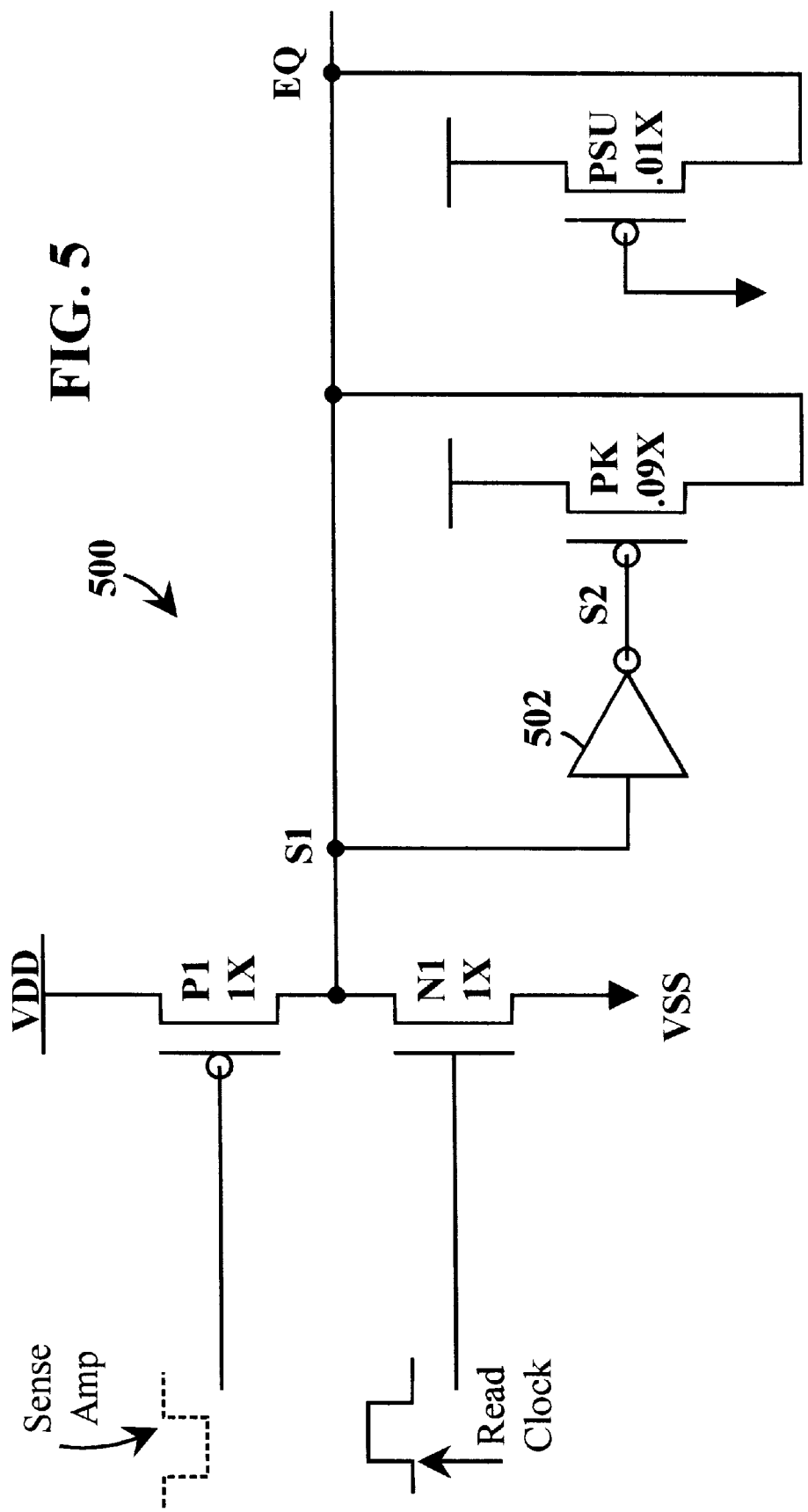
FIG. 5 is a schematic circuit diagram illustrating an additional alternative embodiment of a equilibrate control circuit.

Referring to FIG. 5, an additional alternative embodiment of a equilibrate control circuit 500 is shown. The equilibrate control circuit 500 includes a first inverter 502 having an input terminal connected to the node S1 and an output terminal connected to a keeper p-channel MOSFET PK. In the illustrative embodiment, the keeper p-channel MOSFET PK has a size or conduction value equal to 0.09X in comparison to the 1X size of the pull-up p-channel MOSFET P1 and the pull-down n-channel MOSFET N1. The equilibrate control circuit 500 omits usage of a second inverter and instead connects the gate terminal of the start-up p-channel MOSFET PSU to the VSS reference. The start-up p-channel MOSFET PSU has a size or conduction value equal to 0.01X in comparison to the 1X size of the p-channel MOSFET P1 and the n-channel MOSFET N1.

Figure 6:
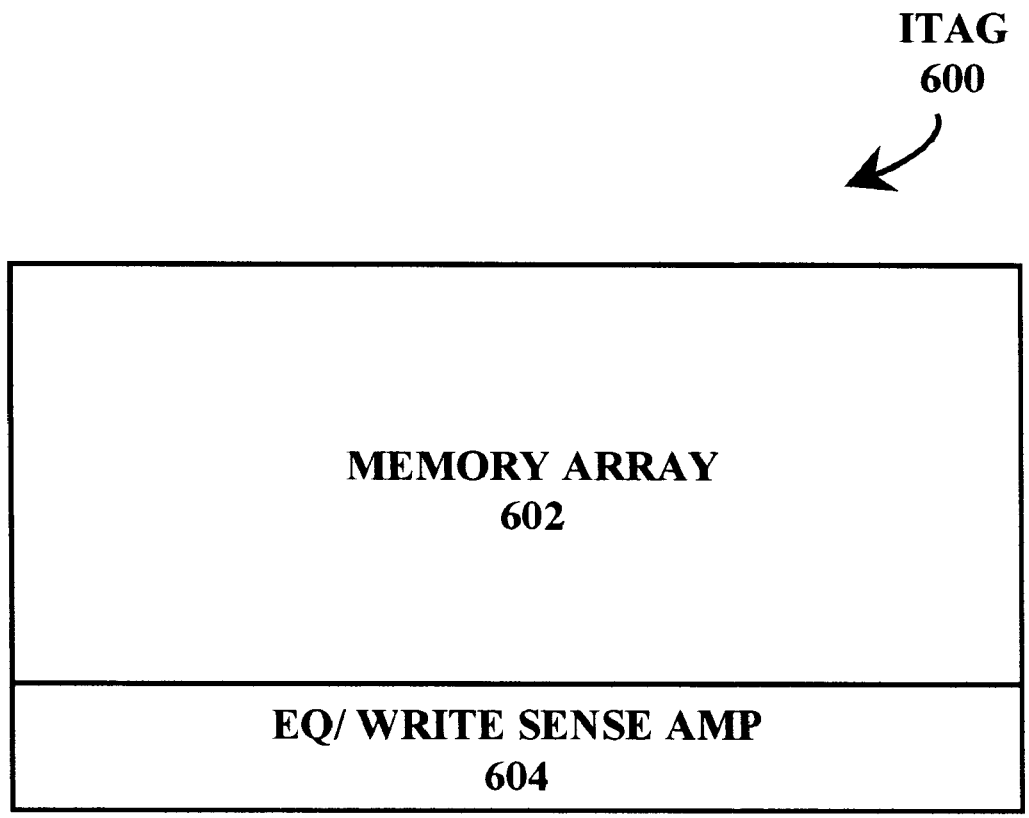
FIG. 6 is a schematic block diagram illustrates an instruction tag memory circuit in which an embodiment of the equilibrate control circuit may be implemented.

Referring to FIG. 6, a schematic block diagram illustrates an instruction tag memory circuit 600 in which an equilibrate control circuit, such as the equilibrate control circuits 400 and 500, may be implemented. The instruction tag memory circuit 600 includes a single memory array 602 and a single equilibrate and write sense amplifier circuit 604. Equilibrate control circuits (not shown) are implemented in the equilibrate and write sense amplifier circuit 604. In embodiments of the instruction tag memory circuit 600 that do not use the equilibrate control circuit, any time the memory array 602 is accessed, dummy read operations are performed to prevent power drain during initialization. The dummy memory access operations are used to set the equilibrate and write sense amplifier circuit 604 to a suitable and correct operating state that controls power drain at start-up.

In contrast, the illustrative embodiments of the equilibrate control circuit advantageously set the equilibrate and write circuits to appropriate states simply by turning on the power.

Figure 7:
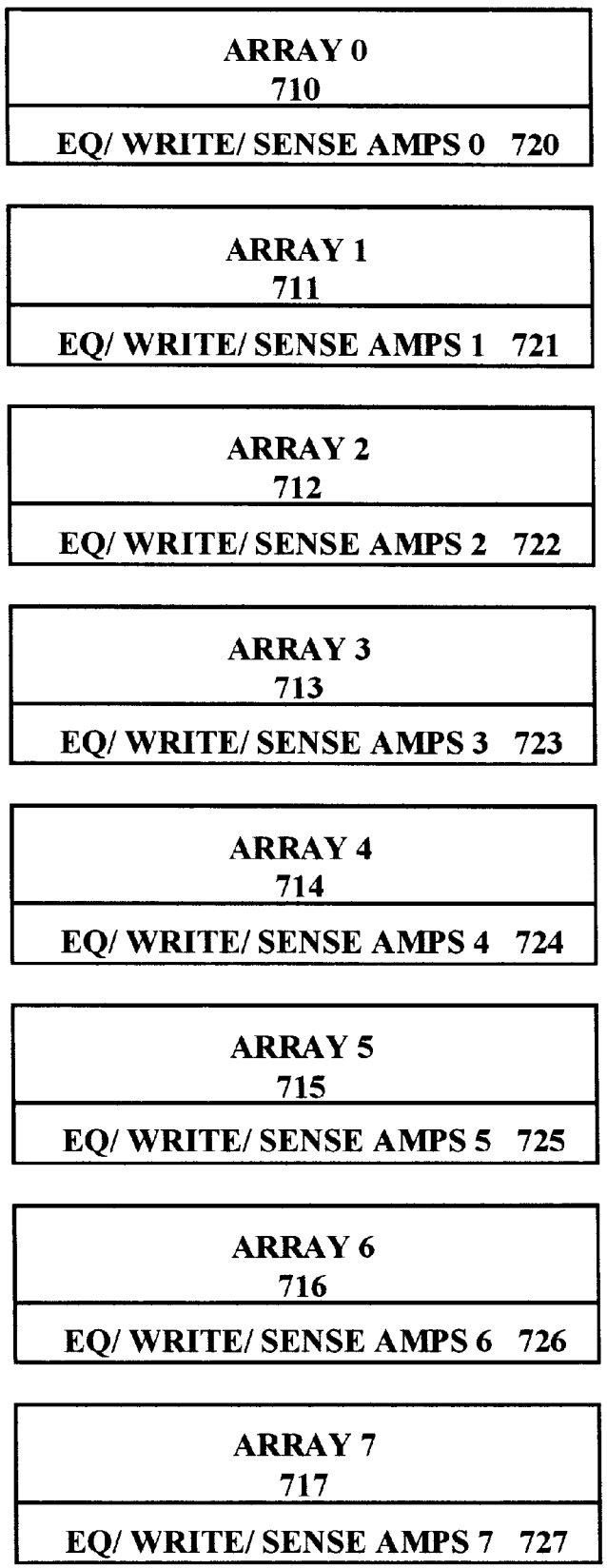
FIG. 7 is a schematic block diagram illustrating a level 2 (L2) cache in which an embodiment of the equilibrate control circuit may be implemented.

Referring to FIG. 7, a schematic block diagram illustrates a level 2 (L2) cache 700 in which an embodiment of the equilibrate control circuit may be implemented. The L2 cache 700 includes not just a single memory but instead includes eight memory banks including array 0 710, array 1 711, and additional arrays in a sequence to array 7 717. Associated with each memory array is a sense amplifier, write, and equilibrate circuit 0 720, 1 721, and additional sense amplifier, write, and equilibrate circuits in a sequence to circuit 7 727. When data in the L2 cache 700 is accessed, only a single memory array of the memory arrays is accessed while the other seven memory arrays remain quiescent to conserve power. Unfortunately, in an L2 cache 700 cache that does not include the equilibrate control circuit, dummy memory access operations must be made to all eight memory arrays during start-up, greatly complicating a power-up procedure. In the illustrative embodiment, start-up is advantageously achieved in all eight memory banks by simply turning on the power.

Figure 8:
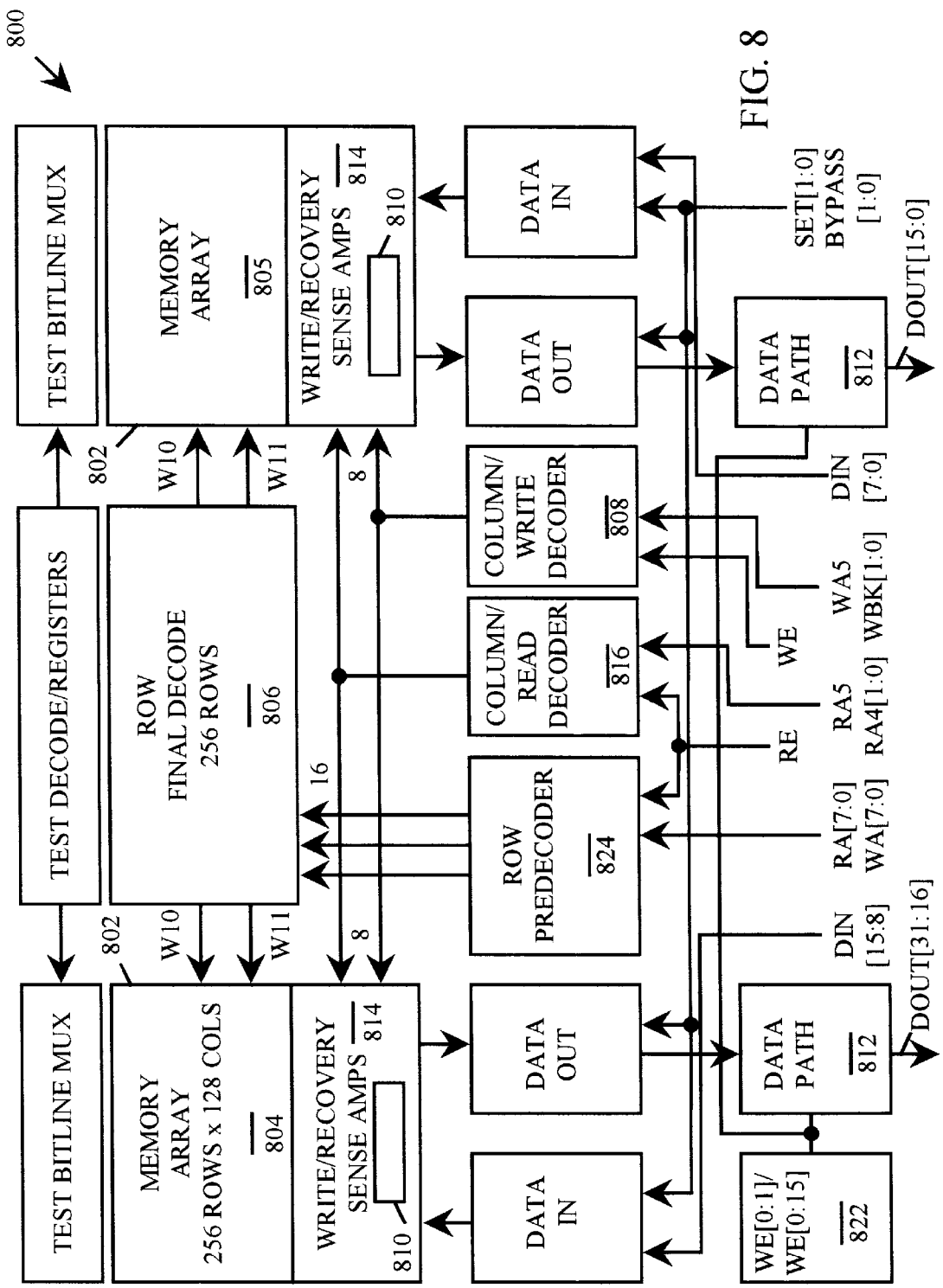
FIG. 8 is an architectural block diagram which illustrates an embodiment of a microprocessor in accordance with an embodiment of the present invention.

Referring to FIG. 8, a schematic block diagram illustrates a suitable cache 800 that includes a plurality of equilibrate control circuits 810. The illustrative cache 800 has, for example, a storage 802 that includes two memory arrays 804 and 805. In one example, the memory arrays 804 and 805 have 256 rows and 128 columns of storage. Each memory array 804 and 805 includes write/recovery sense amplifiers 814 that can be controlled to operate independently or in concert to write data to a data path 812 with a variable cache data width, illustratively 8-bit bytes and 16-bit words. Elements in the memory arrays 804 and 805 are accessed using a row final decoder 806 that addresses the memory arrays 804 and 805 as directed by read address RA[7:0] signals and write address WA[7.0] signals received via a row predecoder 824. Two wordlines per row block are selected, reducing the cell current by half. The write/recovery sense amplifiers 814, which in the illustrative circuit make extensive use of dynamic logic, activate a self-recovered bitline only if a column is written.

Columns of the memory arrays 804 and 805 are read and written, respectively, under the direction of read address RA5 and RA4[1:0] signals via a column read decoder 816 and write address signals WA5 and WBK[1:0] via a column write decoder 808.

Data is written from the memory arrays 804 and 805 to a data path 812 under control of write enable WE[1:0]/WE [0:15] signals 822.

The cache 800 executes one read operation and one write operation per clock cycle. Separate read and write column selects utilize the column read decoder 816 and the column write decoder 808 to read and write an address each clock cycle. Static RAM in the memory arrays 804 and 805 and the datapath access in half clock cycles. structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A power-up initialization circuit comprising:
   a pull-up transistor having an input terminal coupled to receive a first signal and having a pull-up transistor strength;

a pull-down transistor coupled to the pull-up transistor at a node and having an input terminal coupled to receive a second signal, the pull-down transistor having a pull-down transistor strength, the pull-up transistor driving the node to a high state as a function of the first signal, the pull-down transistor driving the node to a low state as a function of the second signal;

a keeper circuit coupled to the node and including a keeper circuit transistor having a keeper circuit strength less than the pull-up transistor strength and less than the pull-down transistor strength, the keeper circuit driving the node to a preferred state unless overpowered by the pull-up transistor and the pull-down transistor; and a start-up circuit coupled to the node and including a startup-circuit transistor having a start-up circuit strength that is less than the keeper circuit strength, the start-up circuit driving the node to the preferred state when the node powers up in a nonpreferred state.

2. A power-up initialization circuit according to claim 1 wherein:

the pull-up transistor is a p-channel MOSFET; and the pull-down transistor is an n-channel MOSFET.

3. A power-up initialization circuit according to claim 1 wherein:

the pull-up transistor is a p-channel MOSFET coupled to receive the first signal, the first signal being a sense amplifier signal; and the pull-down transistor is an n-channel MOSFET coupled to receive the second signal, the second signal being a read clock signal.

4. A power-up initialization circuit according to claim 1 wherein:

the pull-up transistor is a p-channel MOSFET coupled to receive the first signal, the first signal being a sense amplifier signal;

the pull-down transistor is an n-channel MOSFET coupled to receive the second signal, the second signal being a read clock signal; and the pull-up transistor and the pull-down transistor have conduction values, relative to the respective transistor strength, that are approximately equal.

5. A power-up initialization circuit according to claim 1 wherein:

the pull-up transistor and the pull-down are coupled having a source-drain pathway between VDD and VSS.

6. A power-up initialization circuit according to claim 1 wherein:

the keeper circuit includes:

an inverter having an input terminal coupled to the node and having an output terminal; wherein the keeper circuit transistor is coupled to the node and has a control terminal coupled to the output terminal of the inverter.

7. A power-up initialization circuit according to claim 1 wherein:

the keeper circuit includes:

an inverter having an input terminal coupled to the node and having an output terminal; wherein the keeper circuit transistor is coupled to the node and has a control terminal coupled to the output terminal of the inverter, the keeper circuit transistor having the keeper circuit strength relative to the pull-up transistor strength and the pull-down transistor strength so that a conduction value is at most approximately one-third of conduction values, relative to the respective transistor strength, of the pull-up transistor and the pull-down transistor.

8. A power-up initialization circuit according to claim 1 wherein:

the keeper circuit includes:

an inverter having an input terminal coupled to the node and having an output terminal; wherein the keeper circuit transistor is coupled to the node and has a control terminal coupled to the output terminal of the inverter, the keeper circuit transistor having the keeper circuit strength relative to the pull-up transistor strength and the pull-down transistor strength so that a conduction value is at most approximately one-tenth of conduction values, relative to the respective transistor strength, of the pull-up transistor and the pull-down transistor.

9. A power-up initialization circuit according to claim 1 wherein:

the keeper circuit includes:

an inverter having an input terminal coupled to the node and having an output terminal; wherein the keeper circuit transistor is a p-channel MOSFET having a gate coupled to the output terminal of the inverter and a source-drain pathway coupled between VDD and the node.

10. A power-up initialization circuit according to claim 1 wherein:

the keeper circuit includes:

a keeper circuit inverter having an input terminal coupled to the node and having an output terminal; and the keeper circuit transistor coupled to the node and having a control terminal coupled to the output terminal of the keeper circuit inverter; and the start-up circuit includes:

a start-up circuit inverter having an input terminal coupled to the output terminal of the keeper circuit inverter and having an output terminal; and the start-up circuit transistor coupled to the node and having a control terminal coupled to the output terminal of the start-up circuit inverter.

11. A power-up initialization circuit according to claim 1 wherein:

the keeper circuit includes:

a keeper circuit inverter having an input terminal coupled to the node and having an output terminal; and the keeper circuit transistor coupled to the node and having a control terminal coupled to the output terminal of the keeper circuit inverter; and the start-up circuit includes:

a start-up circuit inverter having an input terminal coupled to the output terminal of the keeper circuit inverter and having an output terminal; and the start-up circuit transistor coupled to the node and having a control terminal coupled to the output terminal of the start-up circuit inverter, the start-up circuit transistor having the startup-circuit strength relative to the keeper circuit strength that creates a conduction value that is at most approximately one-third of a conduction value of the keeper circuit transistor.

12. A power-up initialization circuit according to claim 1 wherein:

the keeper circuit includes:

a keeper circuit inverter having an input terminal coupled to the node and having an output terminal; and the keeper circuit transistor coupled to the node and having a control terminal coupled to the output terminal of the keeper circuit inverter; and the start-up circuit includes:

a start-up circuit inverter having an input terminal coupled to the output terminal of the keeper circuit inverter and having an output terminal; and the start-up circuit transistor coupled to the node and having a control terminal coupled to the output terminal of the start-up circuit inverter, the start-up circuit transistor having the startup-circuit strength relative to the keeper circuit strength that creates a conduction value that is at most approximately one-tenth of a conduction value of the keeper circuit transistor.

13. A power-up initialization circuit according to claim 1 wherein:

the keeper circuit includes:

a keeper circuit inverter having an input terminal coupled to the node and having an output terminal; and the keeper circuit transistor coupled to the node and having a control terminal coupled to the output terminal of the keeper circuit inverter; and the start-up circuit includes:

a start-up circuit inverter having an input terminal coupled to the output terminal of the keeper circuit inverter and having an output terminal; and the start-up circuit is a p-channel MOSFET having a gate coupled to the output terminal of the start-up circuit inverter and having a source-drain pathway coupled between VDD and the node.

14. A power-up initialization circuit according to claim 1 wherein:

the keeper circuit includes:

a keeper circuit inverter having an input terminal coupled to the node and having an output terminal; and the keeper circuit transistor coupled to the node and having a control terminal coupled to the output terminal of the keeper circuit inverter; and the start-up circuit includes:

the start-up circuit transistor coupled to the node and having a control terminal coupled to a reference voltage source.

15. A power-up initialization circuit according to claim 1 wherein:

the keeper circuit includes:

a keeper circuit inverter having an input terminal coupled to the node and having an output terminal; and the keeper circuit transistor coupled to the node and having a control terminal coupled to the output terminal of the keeper circuit inverter; and the start-up circuit includes:

the start-up circuit transistor coupled to the node and having a control terminal coupled to a reference voltage source, the start-up circuit transistor having the startup-circuit strength relative to the keeper circuit strength that creates a conduction value that is at most approximately one-third of a conduction value of the keeper circuit transistor.

16. A power-up initialization circuit according to claim 1 wherein:

the keeper circuit includes:

a keeper circuit inverter having an input terminal coupled to the node and having an output terminal; and the keeper circuit transistor coupled to the node and having a control terminal coupled to the output terminal of the keeper circuit inverter; and the start-up circuit includes:

the start-up circuit transistor coupled to the node and having a control terminal coupled to a reference voltage source, the start-up circuit transistor having the startup-circuit strength relative to the keeper circuit strength that creates a conduction value that is at most approximately one-tenth of a conduction value of the keeper circuit transistor.

17. A power-up initialization circuit according to claim 1 wherein:

the keeper circuit includes:

a keeper circuit inverter having an input terminal coupled to the node and having an output terminal; and the keeper circuit transistor coupled to the node and having a control terminal coupled to the output terminal of the keeper circuit inverter; and the start-up circuit includes:

the start-up circuit transistor which is a p-channel MOSFET having a gate coupled to VSS and having a source-drain pathway coupled between VDD and the node.

18. A storage comprising:

a plurality of storage cells;

a plurality of bit lines coupled to the storage cells;

a plurality of equilibrate lines coupled to the storage cells, the equilibrate lines for dynamically and selectively charging individual bit lines of the plurality of bit lines;

a plurality of write select lines coupled to the storage cells, the write select lines for dynamically and selectively discharging the individual bit lines of the plurality of bit lines;

a power-up initialization circuit coupled to a line selected from among the equilibrate lines and the write select lines, the power-up initialization circuit including:

a pull-up transistor having an input terminal coupled to receive a first signal and having a pull-up transistor strength;

a pull-down transistor coupled to the pull-up transistor at a node and having an input terminal coupled to receive a second signal, the pull-down transistor having a pull-down transistor strength, the pull-up transistor driving the node to a high state as a function of the first signal, the pull-down transistor driving the node to a low state as a function of the second signal;

a keeper circuit coupled to the node and including a transistor having a keeper circuit strength less than the pull-up transistor strength and less than the pull-down transistor strength, the keeper circuit driving the node to a preferred state unless overpowered by the pull-up transistor and the pull-down transistor; and a startup-circuit coupled to the node and including a transistor having a start-up circuit strength that is less than the keeper circuit strength, the start-up circuit driving the node to the preferred state when the node powers up in a nonpreferred state.

19. A storage according to claim 18 wherein:

the storage is implemented in an integrated circuit.

20. A processor comprising:

an execution engine;

an instruction decoder coupled to the execution engine, the instruction decoder dynamically decoding instructions into operations and supplying the operations to the execution engine for execution;

a storage coupled to the instruction decoder, the storage dynamically supplying the instructions to the instruction decoder for decoding into the operations, the storage including:

a pull-up transistor having an input terminal coupled to receive a first signal and having a pull-up transistor strength;

a pull-down transistor coupled to the pull-up transistor at a node and having an input terminal coupled to receive a second signal, the pull-down transistor having a pull-down transistor strength, the pull-up transistor driving the node to a high state as a function of the first signal, the pull-down transistor driving the node to a low state as a function of the second signal;

a keeper circuit coupled to the node and including a transistor having a keeper circuit strength less than the pull-up transistor strength and less than the pull-down transistor strength, the keeper circuit driving the node to a preferred state unless overpowered by the pull-up transistor and the pull-down transistor; and a startup-circuit coupled to the node and including a transistor having a start-up circuit strength that is less than the keeper circuit strength, the start-up circuit driving the node to the preferred state when the node powers up in a nonpreferred state.

21. A processor according to claim 20 wherein:

the processor is implemented in an integrated circuit.

22. A processor according to claim 20 wherein:

the processor is implemented in a single-chip integrated circuit.

23. A processor comprising:

an execution engine;

a storage coupled to the execution engine, the storage coupled to a plurality of equilibration lines and write select lines; and a power-up initialization circuit coupled to a line selected from among the plurality of equilibration lines and write select lines, the power-up initialization circuit including:

a pull-up transistor having an input terminal coupled to receive a first signal and having a pull-up transistor strength;

a pull-down transistor coupled to the pull-up transistor at a node and having an input terminal coupled to receive a second signal, the pull-down transistor having a pull-down transistor strength, the pull-up transistor driving the node to a high state as a function of the first signal, the pull-down transistor driving the node to a low state as a function of the second signal;

a keeper circuit coupled to the node and including a transistor having a keeper circuit strength less than the pull-up transistor strength and less than the pull-down transistor strength, the keeper circuit driving the node to a preferred state unless overpowered by the pull-up transistor and the pull-down transistor; and a startup-circuit coupled to the node and including a transistor having a start-up circuit strength that is less than the keeper circuit strength, the start-up circuit driving the node to the preferred state when the node powers up in a nonpreferred state.

24. A processor according to claim 23 wherein:

the processor is implemented in an integrated circuit.

25. A processor according to claim 23 wherein:

the processor is implemented in a single-chip integrated circuit.

26. A method of initializing a circuit comprising:

driving a node to a high state as a function of a first signal using a pull-up transistor having a pull-up transistor strength;

driving the node to a low state as a function of a second signal using a pull-down transistor having a pull-down transistor strength;

driving the node to a preferred state unless overpowered by the driving to the high state as the function of the first signal or by the driving to the low state as the function of the second signal, the node being driven to the preferred state using a keeper circuit with a keeper circuit transistor having a strength less than the strength of the pull-up transistor and less than the strength of the pull-down transistor; and driving the node to the preferred state when the node powers up in a nonpreferred state using a start-up circuit with a start-up circuit transistor having a strength less than the strength of the keeper circuit transistor.

27. A method of initializing a circuit according to claim 26 comprising:

driving the node to the preferred state using the keeper circuit with the keeper circuit transistor having the strength that is at most one-third of the strength of the pull-up transistor and is at most one-third of the strength of the pull-down transistor; and driving the node to the preferred state when the node powers up in the nonpreferred state using the start-up circuit with the start-up circuit transistor having the strength that is at most one-third of the strength of the keeper circuit transistor.

28. A method of initializing a circuit according to claim 26 comprising:

driving the node to the preferred state using the keeper circuit with the keeper circuit transistor having the strength that is at most one-tenth of the strength of the pull-up transistor and is at most one-tenth of the strength of the pull-down transistor; and driving the node to the preferred state when the node powers up in the nonpreferred state using the start-up circuit with the start-up circuit transistor having the strength that is at most one-tenth of the strength of the keeper circuit transistor.

* * * * *